(12) United States Patent
Tan

(10) Patent No.: US 11,789,051 B2
(45) Date of Patent: Oct. 17, 2023

(54) REAL-EQUIVALENT-TIME OSCILLOSCOPE

(71) Applicant: Tektronix, Inc., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/182,056

(22) Filed: Feb. 22, 2021

(65) Prior Publication Data

US 2021/0263085 A1 Aug. 26, 2021

Related U.S. Application Data

(60) Provisional application No. 63/061,098, filed on Aug. 4, 2020, provisional application No. 62/980,071, filed on Feb. 21, 2020.

(51) Int. Cl.
*G01R 23/02* (2006.01)
*G01R 13/02* (2006.01)
*G01R 23/16* (2006.01)

(52) U.S. Cl.
CPC .......... *G01R 23/02* (2013.01); *G01R 13/0218* (2013.01); *G01R 23/16* (2013.01)

(58) Field of Classification Search
CPC .... G01R 23/02; G01R 13/0218; G01R 23/16; G01R 31/319
See application file for complete search history.

(56) References Cited

U.S. PATENT DOCUMENTS

| 2007/0109159 A1 | 5/2007 | Stein |
| 2008/0187033 A1 | 8/2008 | Smith |
| 2009/0003502 A1 | 1/2009 | Campiche et al. |
| 2011/0311009 A1* | 12/2011 | Flynn ................. G01R 13/0218 375/354 |
| 2014/0232581 A1 | 8/2014 | Nguyen et al. |

FOREIGN PATENT DOCUMENTS

| AU | 2006301873 B2 * | 4/2009 | ........... H04L 7/0054 |
| CN | 101867387 | 10/2010 | |
| EP | 3754349 | 12/2020 | |
| WO | 2014191712 | 12/2014 | |

OTHER PUBLICATIONS

European Patent Office, International Search Report and Written Opinion of the International Searching Authority for International Application PCT/US2021/019102, dated May 21, 2021, 37 pages, Rijswijk, Netherlands.

* cited by examiner

*Primary Examiner* — Roy Y Yi
*Assistant Examiner* — Geoffrey T Evans
(74) *Attorney, Agent, or Firm* — Miller Nash LLP; Andrew J. Harrington

(57) ABSTRACT

A test and measurement instrument, such as an oscilloscope, having a Nyquist frequency lower than an analog bandwidth, the test and measurement instrument having an input configured to receive a signal under test having a repeating pattern, a single analog-to-digital converter configured to receive the signal under test and sample the signal under test over a plurality of repeating patterns at a sample rate, and one or more processors configured to determine a frequency of the signal under test and reconstruct the signal under test based on the determined frequency of the signal, the pattern length of the signal under test, and/or the sample rate without a trigger.

16 Claims, 14 Drawing Sheets

REAL-EQUIVALENT-TIME OSCILLOSCOPE

PRIORITY

This disclosure claims benefit of U.S. Provisional Application No. 62/980,071, titled "REAL-EQUIVALENT-TIME OSCILLOSCOPE," filed on Feb. 21, 2020, and U.S. Provisional Application No. 63/061,098, titled "SOFTWARE CLOCK DATA RECOVERY FOR REAL-EQUIVALENT-TIME OSCILLOSCOPES," filed on Aug. 4, 2020, each of which is incorporated herein by reference in its entirety.

FIELD OF THE INVENTION

This disclosure is directed to systems and methods related to test and measurement systems, and in particular, to real-equivalent-time data acquisition in test and measurement instruments.

BACKGROUND

Conventional high-end equivalent-time oscilloscopes and conventional real-time oscilloscopes can be used for high-speed signal integrity measurements and debugging in research and development, as well as in production. Conventional high-end equivalent-time oscilloscopes, however, have a slower acquisition rate and higher cost due to a hardware trigger. Conventional real-time oscilloscope have an extra high acquisition rate but at a high cost due to the number of hardware components required to achieve high acquisition rate, such as a number of analog-to-digital converters. The multiple analog-to-digital converters can also result in errors due to the interleaving mismatch between multiple track-and-hold circuits and analog-to-digital converters.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which:

FIG. 16 is an eye diagram generated based on the operation of FIG. 12 with spread spectrum clocking turned on.

FIG. 18 is a reconstructed waveform based on the operation of FIG. 12 with spread spectrum clocking turned on.

DESCRIPTION

Figure 1:
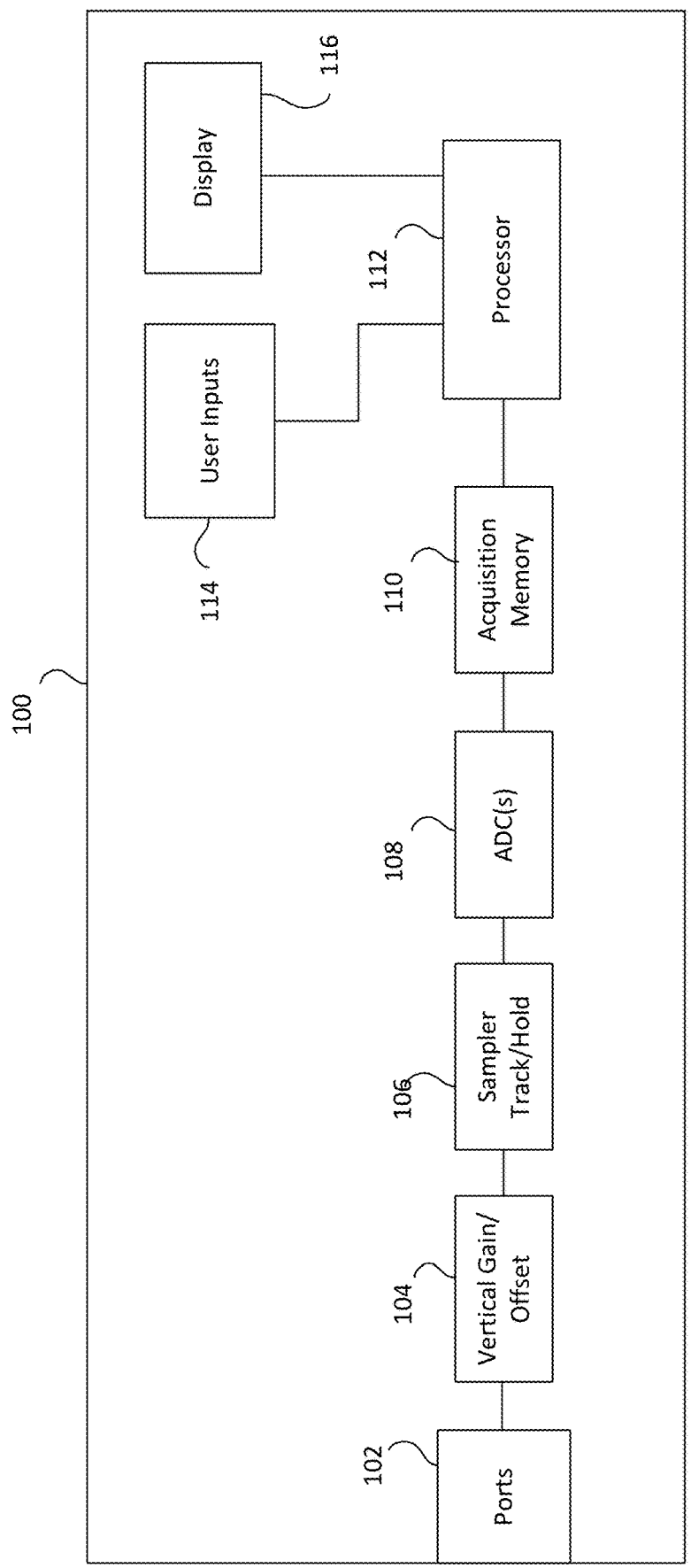
FIG. 1 is a block diagram of a test and measurement instrument according to examples of the disclosure.

Disclosed herein is a real-equivalent-time oscilloscope that has high analog bandwidth and uses software clock recovery to extract a clock from the data signal and reconstruct the pattern of the acquired signal based on the extracted clock.

For volume production environments, there is a demand for test and measurement instruments that are lower cost than conventional equivalent-time oscilloscopes and conventional real-time oscilloscopes but still meet the requirements for production testing. Examples of the disclosure include a test and measurement instrument 100, discussed in more detail below, which has a high bandwidth, low jitter, lower vertical noise, and a clock recovery capability.

Speeds of signals under test are progressing continuously to higher rates, which requires the test and measurement instrument 100 to have a bandwidth high enough to faithfully capture the signal contents. As the signal under test's bit and/or baud rate increases, the unit interval (UI) decreases, which causes the tolerance for horizontal jitter to decrease. The increase in the signal under test's bit and/or baud rate can also cause the inter-symbol-interference impact on the signal under test to increase, even with transmitter and receiver equalizers, which results in the vertical eye margin decreasing. The widely used lower power signaling scheme for devices under test can also decrease a vertical eye margin. Most test and measurement instruments are used to monitor or acquire signals under test that have repeating data patterns, such as, for example, a pseudorandom binary sequence (PRBS) signal or a short stress pattern random-quaternary (SSPRQ) signal, etc. The test and measurement instrument 100, as discussed in more detail below, can recover the clock from the data signals.

Conventional real-time oscilloscopes can sample an entire input waveform in one pass. That is, the acquisition and the display can occur in the same time frame. To do this, conventional real-time oscilloscopes have a sampling rate high enough for an analog bandwidth to prevent aliasing when acquiring a signal under test with a high speed. For example, real-time oscilloscopes can have an analog bandwidth of 70 GHz and a sample rate of 200 giga samples/second (GS/s). The Nyquist frequency of 100 GHz is higher than the analog bandwidth so there is no aliasing. Since the Nyquist rate is so high in a conventional real-time oscilloscope, the analog signal under test can be acquired without a trigger and without aliasing. All conventional real-time oscilloscopes have a sample rate which provides a Nyquist frequency higher than the analog bandwidth. Conventional real-time oscilloscopes, however, are expensive and can be cost-prohibitive for production testing.

Conventional high-end equivalent-time sampling oscilloscopes take advantage of the nature of a repetitive signal by using samples from several trigger events to digitally reconstruct the waveform. A clock and data recovery unit can be used to cause a hardware trigger of the equivalent-time oscilloscope to take the samples. Because repetitive signals are being sampled, the bandwidth of an equivalent-time scope can far exceed its sample rate. For example, an equivalent-time sample oscilloscope can have a very low sample rate, such as 200 kilo samples per second (KS/s), but can have a high vertical resolution, usually more than 12-bit resolution. Conventional equivalent-time oscilloscopes use the equivalent-time sampling technique to reconstruct the pattern waveform of the signal based on the pattern trigger.

FIG. 1 illustrates an example block diagram of a real-equivalent-time test and measurement 100 instrument according to some configurations of the disclosure. The test and measurement instrument 100 includes one or more ports 102 which may be any electrical signaling medium. Ports 102 may include receivers, transmitters, and/or transceivers. Each port 102 is a channel of the test and measurement instrument 100.

The signals from the ports are then sent to a vertical offset 104 which can adjust the offset or baseline of the received signal. In some configurations or examples, the vertical offset 104 may also include a vertical gain adjustment. If there is no vertical gain adjustment, vertical noise can be reduced, but there is also a decrease in the dynamic range. To address this, in some examples, an external attenuator and/or amplifier may be used to attenuate and/or amplify the incoming signal under test. The signal is sent to a sampler track and hold circuit 106 from the vertical offset 104. The track and hold circuit 106 holds each signal steady for a period of time sufficient to enable acquisition by a high-resolution analog-to-digital converter 108.

The analog-to-digital converter 108 converts the analog signal from the track and hold circuit 106 to a digital signal. The analog-to-digital converter 108 have a sampling rate that is greater than equivalent-time test and measurement instruments, but less than real-time test and measurement instruments. For example, the analog-to-digital converters 108 can sample the signals from a few GS/s to tens of GS/s. In some configurations, the analog-to-digital converters 108 can sample the analog signal between 1 GS/s to 100 GS/s. In other configuration, the analog-to-digital converters can sample the analog signal between 2 GS/s and 25 GS/s. The digitized signal from the analog-to-digital converters 108 can then be stored in an acquisition memory 110. That is, the sampling rate is set such that the Nyquist frequency, which is half the sampling rate, is lower than the analog bandwidth of the analog-to-digital converters 108. The analog-to-digital converter 108 could be a single high-resolution analog-to-digital converter, such as a 12-bit analog-to-digital converter.

One or more processors 112 may be configured to execute instructions from memory and may perform any methods and/or associated steps indicated by such instructions, such as receiving the acquired signals from the acquisition memory 110 and reconstructing the signal under test without the use of a hardware trigger or acquiring the sample in the high acquisition rate.

Memory 110 or any other memory on the test and measurement instrument 100 may be implemented as processor cache, random access memory (RAM), read only memory (ROM), solid state memory, hard disk drive(s), or any other memory type. Memory acts as a medium for storing data, computer program products, and other instructions.

User inputs 114 are coupled to the one or more processors 112. User inputs 114 may include a keyboard, mouse, trackball, touchscreen, and/or any other controls employable by a user to interact with a GUI on the display 116. The display 116 may be a digital screen, a cathode ray tube based display, or any other monitor to display waveforms, measurements, and other data to a user. While the components of the test and measurement instrument 100 are depicted as being integrated within test and measurement instrument 100, it will be appreciated by a person of ordinary skill in the art that any of these components can be external to the test and measurement instrument 100 and can be coupled to the test and measurement instrument 100 in any conventional manner (e.g., wired and/or wireless communication media and/or mechanisms). For example, in some examples, the display 116 may be remote from the test and measurement instrument 100.

Figure 2:
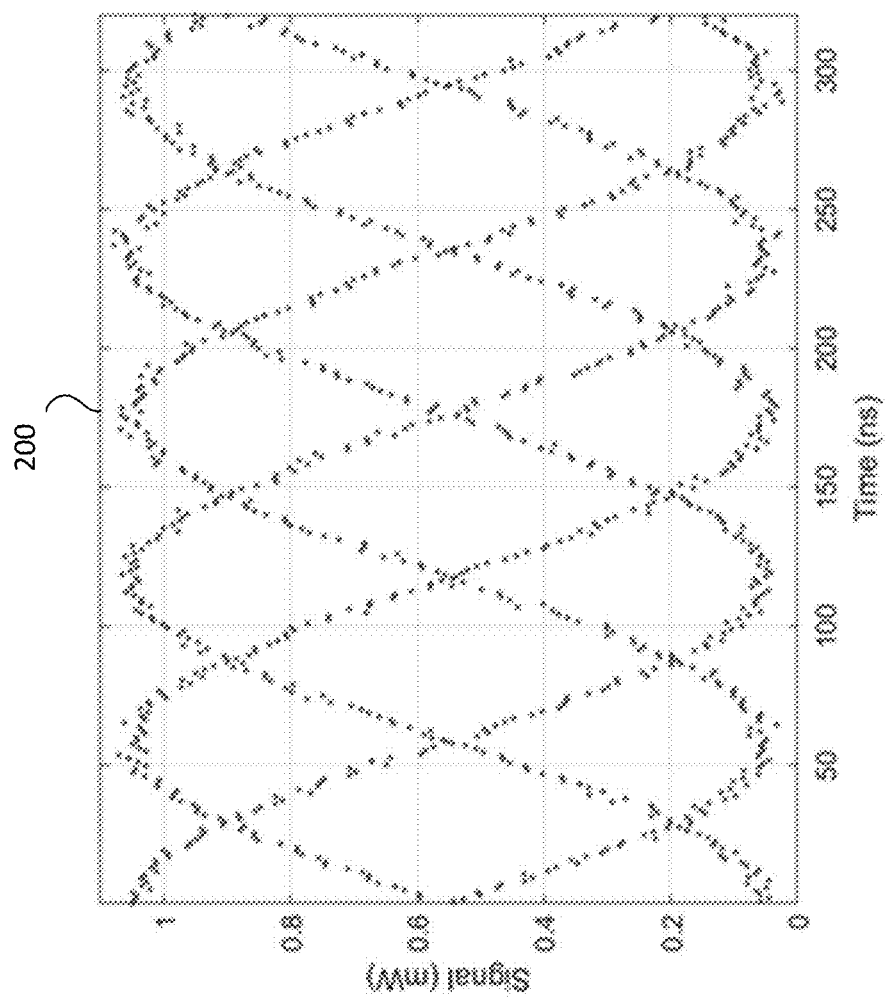
FIG. 2 is an example of an aliased signal under test sampled by the test and measurement instrument of FIG. 1.

FIG. 2 illustrates a plot 200 of a sampled waveform that may be acquired using the test and measurement instrument of FIG. 1. The signal under test is a sine wave signal, but as can be seen in FIG. 2, the test and measurement instrument 100 samples the signals so that it appears aliased. This is because the Nyquist frequency is lower than the analog bandwidth of the test and measurement instrument 100 and lower than the frequency of the sine signal. In the example waveform of FIG. 2, a 13.28125 GHz sine signal was acquired at a sampling rate of 3.124 GS/s, resulting in the aliased waveform shown in plot 200 of FIG. 2.

Figure 4:
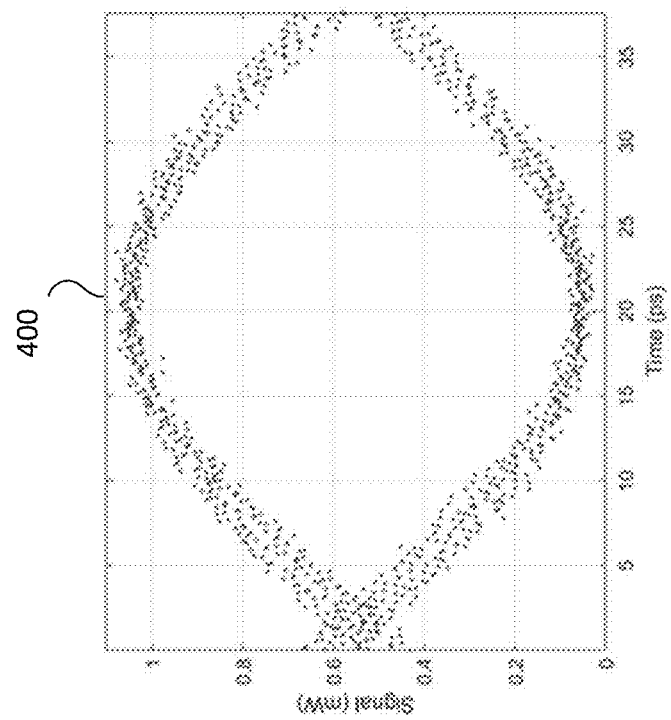
FIG. 4 is an example of an eye diagram according to other examples of the disclosure.
Figure 3:
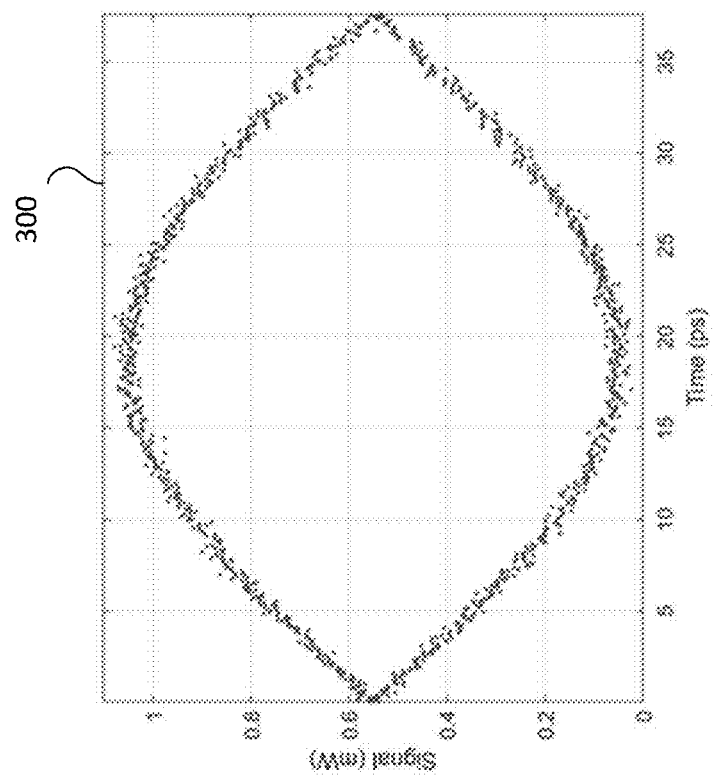
FIG. 3 is an example of an eye diagram according to some examples of the disclosure.

Once the signal under test has been acquired, the processor 112 can determine the accurate bit and/or baud rate for the signal to reconstruct the signal samples received at the acquisition memory 110. In some examples, the bit rate can be determined by a user inputting the frequency of the signal under test through the user input 114. However, in other examples when the frequency of the signal under test is not known, the processor 112 can iteratively adjust the aliased waveform signal to generate an eye diagram until the eye diagram has the widest horizontal opening. That is, different bit and/or baud rates can be chosen until the eye of the eye diagram is open the most. In some examples, a user may set how accurate the bit and/or baud rate detection may be through the user inputs 114. For example, FIGS. 3 and 4 illustrate eye diagrams 300 and 400 determined from the acquired samples in the acquisition memory 110. The eye diagram 300 of FIG. 3 is more open than the eye diagram 400 of FIG. 4 and as such has a more accurate bit and/or baud rate than the eye diagram of FIG. 4. From the eye diagram, a bit and/or baud rate can be determined based on the horizontal opening of the eye.

Once the bit and/or baud rate has been determined, since the sampling rate of the test and measurement instrument 100 is known, the processor 112 can then reconstruct the signal under test and place each received sample in the appropriate position in the signal. The processor 112 can then output the reconstructed signal to the display or to another device. For example, when the bit rate is known, that is, how often each bit of the signal is received, and it is known how often a sample is taken, the processor 112 can use this information to appropriately place each sample in the reconstructed signal. That is, for every sample received, if the bit and/or baud rate is known, as well as the sample rate, it is known how many bits to skip before placing the sample in the reconstructed signal. In the test and measurement instrument 100, a hardware trigger and/or hardware clock recover is not used to recover the clock.

Figure 5:
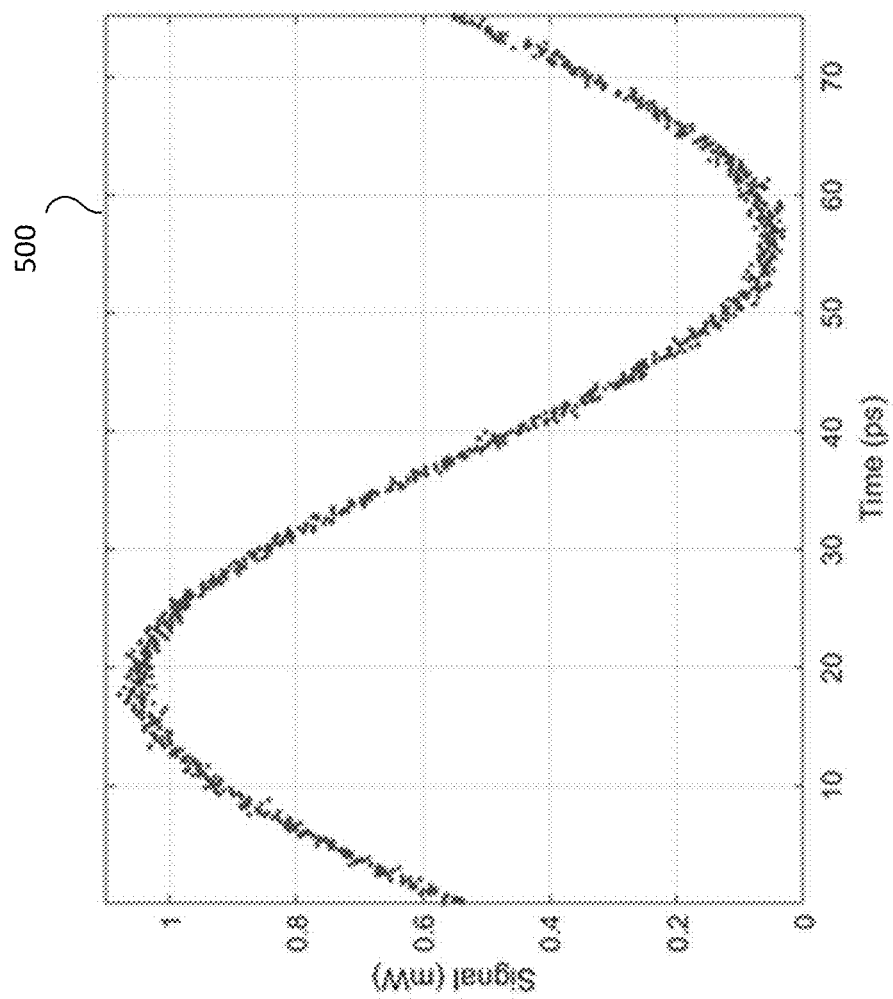
FIG. 5 is an example of a reconstructed signal based on the aliased signal in FIG. 2.

FIG. 5 is an example of a plot 500 showing the reconstructed signal of the acquired signal in FIG. 2. As the processor 112 determines the correct position of each of the bits, the bits are placed in their appropriate position and the reconstructed signal can be displayed on the display 116 of the test and measurement instrument 100.

In some examples, the test and measurement instrument 100 may include a phase lock loop (PLL). A PLL is a control system that generates an output clock signal whose phase is related to the phase of an input signal. When a PLL is used in some examples to track a low frequency jitter, the processor 112 can adjust the bit and/or baud rate along sections of the reconstructed waveform to mimic the PLL effects. The analog-to-digital converter 108 samples at multi-giga samples per second, which is much higher than the typical PLL bandwidth of tens of megahertz. This allows for enough bits and/or symbols in the local sections of the waveform to adjust the bit and/or baud rate to track the low frequency jitter.

The processor 112 can also detect the pattern length based on the fact that when a pattern length is detected correctly, the eye diagram becomes a pattern waveform. The difference between an eye diagram and a pattern waveform is that for each horizontal position, the eye diagram may have multiple vertical values, as shown in FIG. 3-4; whereas the pattern waveform has one vertical value, as shown in FIG. 5. In the sample shown in FIGS. 2-5, the sine signal under test can be treated as a repeating pattern with a pattern length of two. As there are two bits for every period of the sine. When the pattern length is set to two, the pattern waveform is the reconstructed waveform 500 shown in FIG. 5. For a PRBS15 pattern, for example, the pattern length is 2^15-1. Each bit in the pattern repeats after integer numbers of pattern repeats.

In some examples, the processor 112 can adjust the sample rate of the analog-to-digital converter 108 to avoid a situation where the sample rate is in synchronization with the signal bit and/or baud rate. Further, since the processor 112 is capable of adjusting the sample rate, the processor 112 can sample the same signal under test using a variety of different sample rates. The same frequency contents of the signal may be aliased to different frequencies with different sample rates. The processor 112 can use each of the different acquired signals to determine the most accurate clock recovery to reconstruct the signal under test.

Figure 6:
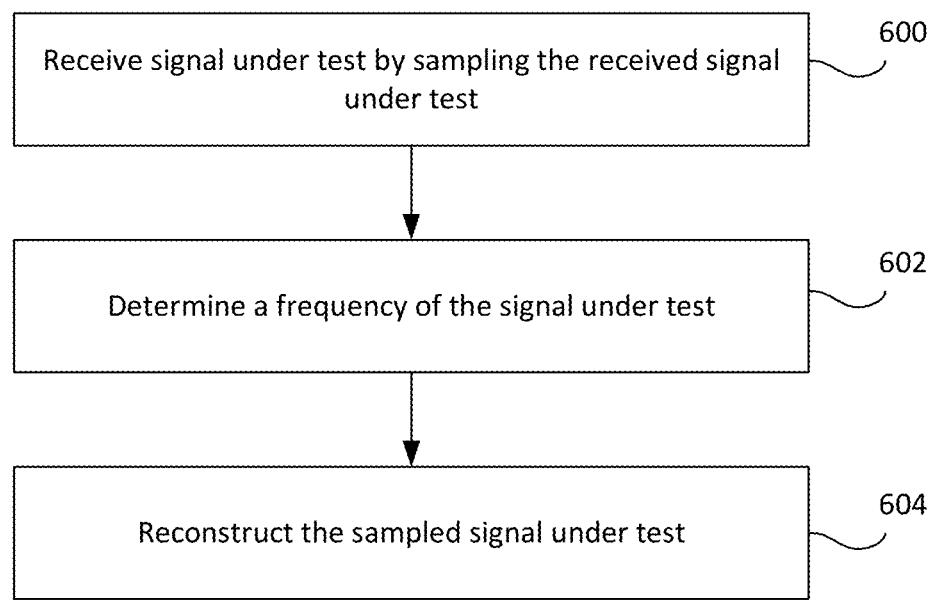
FIG. 6 is a flow chart of an example method of acquiring and reconstructing a signal under test according to examples of the disclosure.

FIG. 6 is a flow chart illustrating the operation of the test and measurement instrument 100 according to examples described herein. In operation 600, the test and measurement instrument 100, having a Nyquist frequency that is less than the analog bandwidth, receives a signal under test. In the test and measurement instrument 100, the sample rate is at least 2 GS/s.

In operation 602, the processor 112 of the test and measurement instrument 100 determines a frequency of the signal under test based on the acquired signal stored in the acquisition memory 110 obtained during operation 600. To determine the frequency, in some examples, the processor 602 generates an eye diagram and iteratively adjusts the bit and/or baud rate until the eye diagram has the widest horizontal opening.

Once the bit and/or baud rate has been determined, the processor 112 can reconstruct the signal under test based on the sampling rate of the test and measurement instrument 100 and the determined bit and/or baud rate of the signal under test in operation 604. The processor 112 can determine the bit and/or baud rate and reconstruct the signal under test without the use of a hardware pattern trigger. This allows the test and measurement instrument 100 to sample the data at a faster rate, but at less expense than using a real-time sampling oscilloscope.

Examples of the disclosure provides benefits over conventional real-time and equivalent time test and measurement instruments. For example, examples of the disclosure allow for low vertical noise, low horizontal jitter, and high acquisition speed, all at a low cost compared to real-time test and measurement instruments and equivalent-time test and measurement instruments.

An equivalent time test and measurement instrument has extra low noise floor from its straight analog signal path, sampling technique, and high-resolution analog-to-digital converter. A real-time test and measurement instrument has high noise because the analog signal path contains a gain stage, interleave between multiple track and hold circuits and analog-to-digital converters cannot completely avoid the mismatch between the interleave pipes. While the mismatch can be mitigated through calibration, there is still residual mismatch error and environment changes can have an impact on the mismatch. Examples of the disclosure, however, uses a single high resolution analog-to-digital converter which can reduce the quantization error compared to multiple 8-bit analog-to-digital converters used in a real-time test and measurement instrument. The single analog-to-digital converter 108 avoids an interleave error.

Horizontal jitter in examples of the disclosure is low because the acquisition happens in a short period of time and there is no interleave error, like a real-time test and measurement instrument. An equivalent time test and measurement instrument can only improve horizontal jitter with the use of costly additional hardware.

Examples of the disclosure have a fast acquisition speed, generally between a few GS/s to tens of GS/s, such as 1 GS/s to 100 GS/s in some configurations, or 2 GS/s to 25 GS/s in other configurations, which is much quicker than an equivalent time test and measurement instrument which happens at a low sample rate, such as 200 KS/s to achieve the low vertical noise. A real-time test and measurement instrument has extra fast acquisition of 200 GS/s, but does this by using the interleave scheme discussed above which can result in vertical noise and horizontal jitter, as well as added cost.

That is, the real-time test and measurement instrument has a high cost due to the hardware required to achieve the extra high sample rate. An equivalent time test and measurement instrument also has a high cost due to requiring a clock source to trigger its sampler. However, examples of the disclosure provide a lower cost test and measurement instrument with higher acquisition rate using a single analog-to-digital converter and no trigger circuit.

In some examples of the disclosure, a test and measurement instrument can include both a real-time mode and a real-equivalent-time mode. The real-time mode of the test and measurement instrument may provide a full view of the signal, while the real-equivalent-time mode can provide more high-bandwidth channels with the same number of analog-to-digital converters in the oscilloscope. In the real-time mode, the test and measurement instrument utilizes more than one analog-to-digital converters for each channel, resulting in a high sample rate. For the real-equivalent-time mode, only one analog-to-digital converter is used for each channel, resulting in a lower sample rate, but higher acquisition speed.

Figure 7:
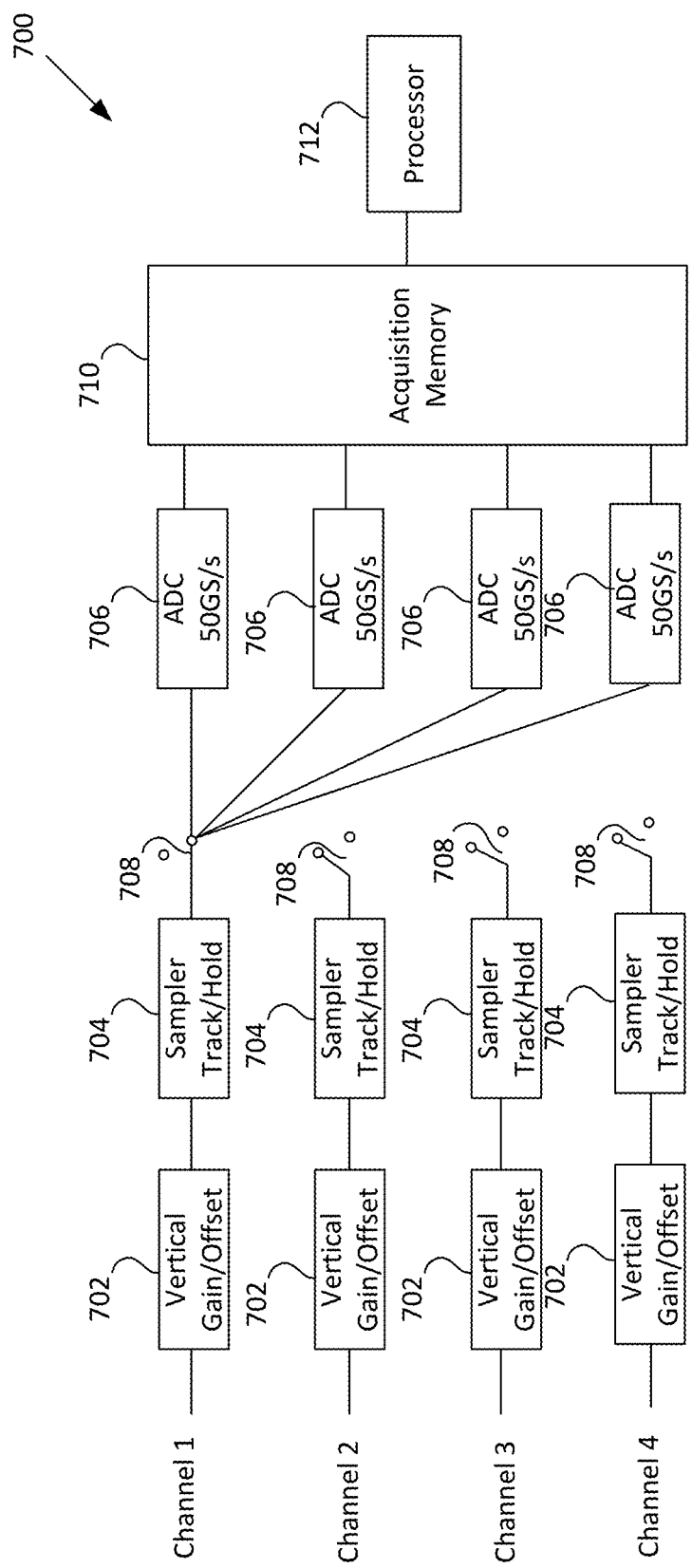
FIG. 7 is a block diagram of a test and measurement instrument operating in a real-time mode.
Figure 8:
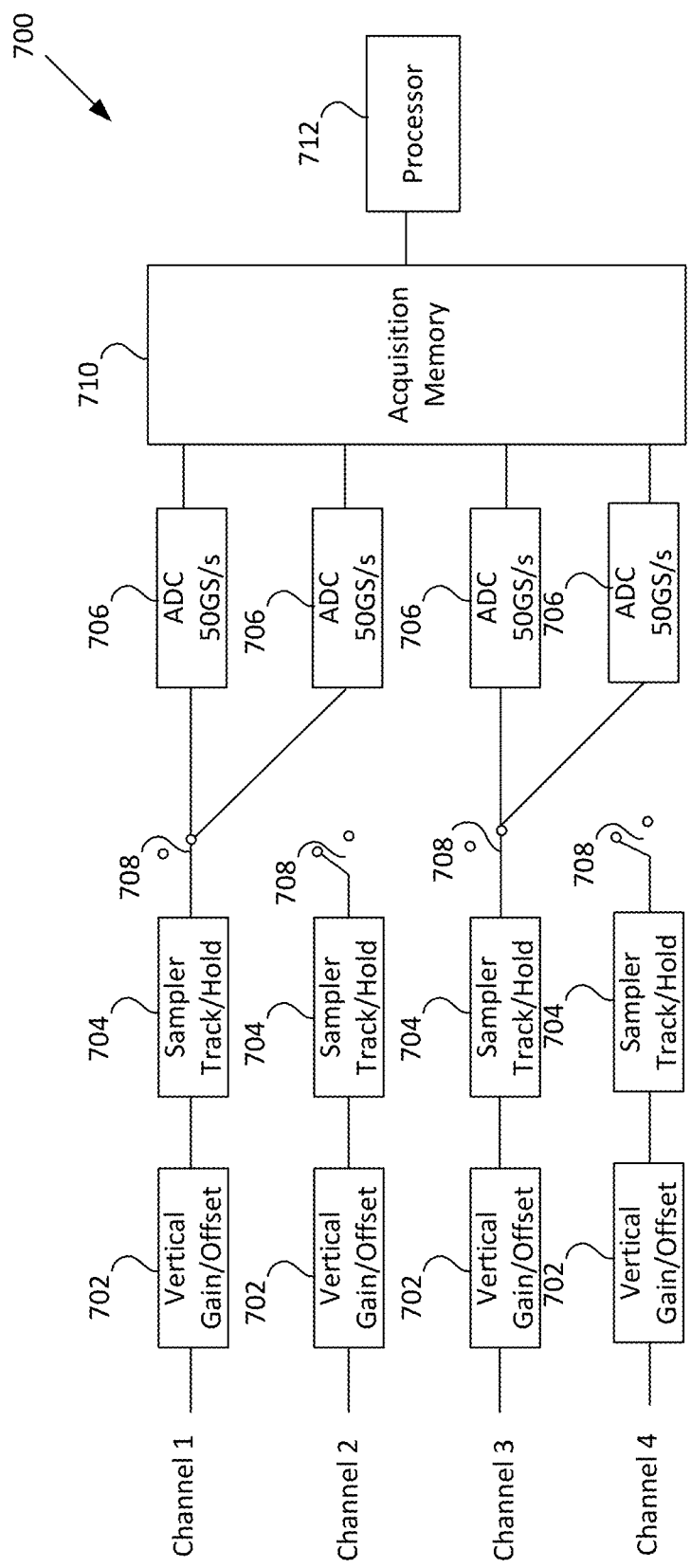
FIG. 8 is another block diagram of a test and measurement instrument operating in a real-time mode.
Figure 9:
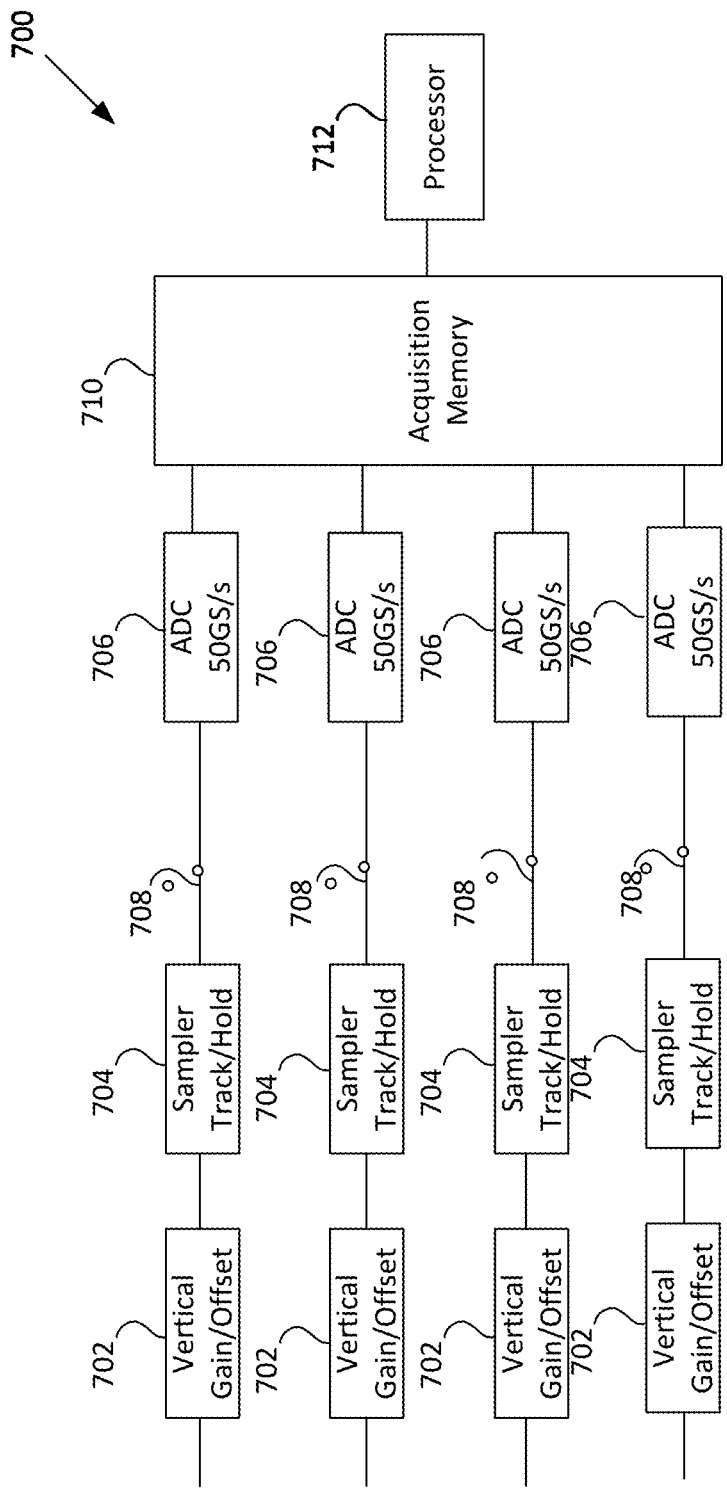
FIG. 9 is a block diagram of a test and measurement instrument operating in a real-equivalent-time mode.

FIGS. 7-9 illustrate an example block diagram of a portion of a test and measurement instrument that includes both a real-time mode and a real-equivalent-time mode. As will be understood by a person having ordinary skill in the art, the test and measurement instrument of FIGS. 7-9 may include components not illustrated, such a user input, display, and other hardware components, such as, but not limited to, those shown in FIG. 1.

In the test and measurement instrument 700 of FIGS. 7-9, four channels are illustrated for ease of discussion, though examples of the disclosure are not limited to four channels. Each channel includes a vertical gain/offset 702, a sampler track and hold circuit 704, and an analog-to-digital converter 706, similar to the vertical offset 104, sample track and hold circuit 106, and analog-to-digital converter 108 discussed above.

FIGS. 7 and 8 illustrate the test and measurement instrument 700 operating in a real-time mode while FIG. 9 illustrates the test and measurement instrument 700 operating in a real-equivalent-time mode. In this example, during the real-time mode illustrated in FIG. 7, each of channels 2, 3, and 4 are disengaged while channel 1 operates as a real-time mode channel. A signal from a device under test is received at channel 1, and is processed through the vertical gain/offset 702 and the sampler track and hold circuit 704. Switches 708 and relays may be provided to route the signal to a number of different analog-to-digital converters 706.

In this example, the switches are operated to route the signal from the sampler track and hold circuit 704 to each of the four analog-to-digital converters 706. Since the analog-to-digital converters 706 are each 50 GS/s in this example, routing the signal from the sampler track and hold circuit 704 to each of the four analog-to-digital converters 706 can achieve a sampling rate of 200 GS/s. The switches 708 may be operated either by the processor 712 or another controller component within the test and measurement instrument based on the selected mode of the test and measurement instrument. As will be understood by one skilled in the art, the selected mode of the test and measurement instrument may be selected from a user interface, such as that shown in FIG. 1, for example.

The signal may be sampled by the four analog-to-digital converters 706 and reconstructed by the processor 712 using any known methods, such as time-interleaving the analog-to-digital converters 706 in the real-time mode.

The test and measurement instrument 700 can be used in a number of different real-time mode configurations, as needed by the operator and based on the signal under test. For example, instead of a single channel activated in the real-time mode, as illustrated in FIG. 7, two channels may be configured and activated as real-time channels.

In FIG. 8, channels 1 and 3 can be configured as two real-time 33 GHz channels with 100 GS/s per channel in this example. That is, each of the two channels 1 and 3 is utilizing two 50 GS/s analog-to-digital converters 706. Channels 2 and 4, on the other hand, are disconnected and not in use during this mode. The sample rate of the real-time mode may be selected, for example, through the user interface. A controller or processor within the test and measurement instrument may then operate the switches and the user interface may inform the user which channels are currently operating in the real-time mode.

FIG. 9 illustrates the test and measurement instrument in the real-equivalent time mode, with each of the channels 1-4 connected to a respective analog-to-digital converter 706. This mode can operate as discussed above with respect to FIGS. 1-8. Whether in real-time mode or real-equivalent-time mode, the output of the analog-to-digital converters 706 are sent to the acquisition memory 710 and further processed by the processor 712, as discussed in detail above with respect to FIG. 1.

While FIGS. 7-9 show only four channels and only four analog-to-digital converters 706, as will be understood by one of ordinary skill in the art, additional channels and/or additional analog-to-digital converters 706 may be provided in the test and measurement instrument 700. Four channels were illustrated in FIGS. 7-9 only for ease of illustration and discussion.

A test and measurement instrument 700 that includes both a real-time mode and a real-equivalent-time mode can use the real-time mode to check all the components of a signal under test, as there is no or very little aliasing present in the acquisition of the signal. The real-time mode can also be used to detect symbol rate and pattern length. The detected symbol rate and pattern length from the real-time mode may then be used in the real-equivalent-time mode in some examples. In the real-equivalent-time mode, the test and measurement instrument 700 has more high bandwidth channels to measure multiple signals simultaneously, which may be used during compliance testing of a device under test, for example.

As mentioned above, during a real-time mode, the channels used for real-time acquisition have a higher sample rate. However for some high bandwidth test and measurement instruments, the gap between the analog bandwidth and the Nyquist frequency may be small. For example, a real-time channel may have 20 GHz analog bandwidth and a Nyquist frequency of 25 GHz with 50 GS/s analog-to-digital converters 706. The analog front-end with a gain of negative three decibels (dB) at 20 GHz may still allow some signal content beyond the 25 GHz analog bandwidth to pass through with certain attenuations. These attenuated high frequency components will be aliased after the track and hold sampler 704 and the analog-to-digital converters 706. In such situations, using software data clock recovery, as discussed in more detail below, the real-equivalent-time mode can be used to check if there are significant high-frequency components beyond the Nyquist frequency passing through the analog front end of the test and measurement instrument.

The real-equivalent-time mode in the test and measurement instrument 700 can also be used in some examples to measure signals that do not have repeating patterns. For data signals that are not repetitive, the real-equivalent-time mode can be used to obtain the eye diagrams and the measurements of the eye diagram discussed above can be performed.

As an example of an operation of a test and measurement instrument 700, signals from a source that generates 32 GBaud 4-level pulse amplitude modulation (PAM4) with a pseudorandom binary sequence (PRBS), such as PRBS13Q, data pattern with spread spectrum clocking (SSC) are acquired. In the real-time mode, the signal is sampled at 200 GS/s with an analog bandwidth of 33 GHz and in the real-equivalent time mode, the signal is sampled at 50 GS/s with an analog bandwidth of 33 GHz.

Figure 10:
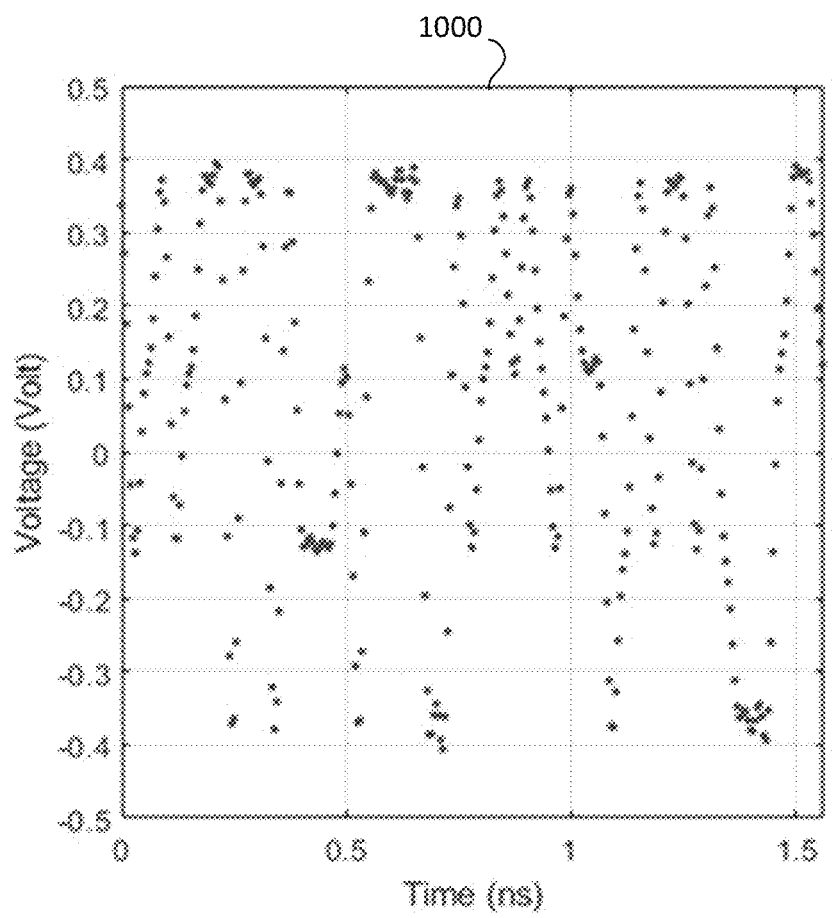
FIG. 10 is a plot of a recovered waveform acquired during a real-time mode of the test and measurement instrument of FIG. 8.
Figure 11:
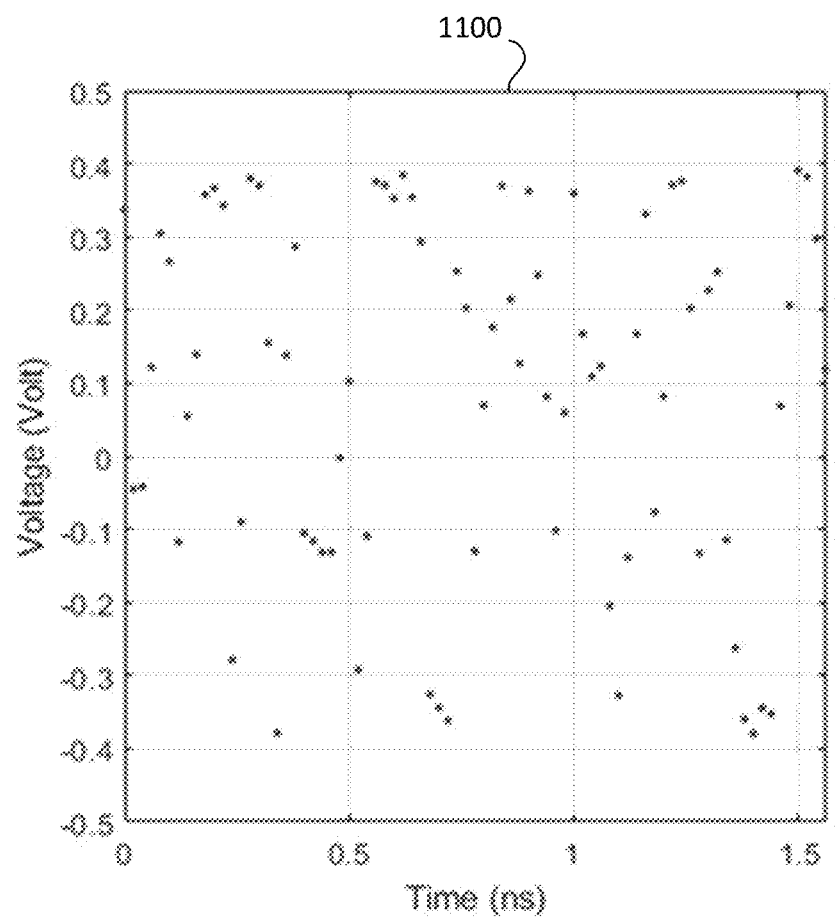
FIG. 11 is a plot of a recovered waveform acquired during a real-equivalent-time mode of the test and measurement instrument of FIG. 9.

FIG. 10 illustrates a plot 1000 of a recovered waveform using the real-time mode of the test and measurement instrument 700. The sample rate of the real-time mode is high enough for a 33 GHz bandwidth signal to allow the PAM4 pattern to be visible in the recovered waveform. On the other hand, FIG. 11 illustrates a plot 1100 of a recovered waveform using the real-equivalent-time mode which has a sample rate of 50 GS/s in this example. The Nyquist frequency is 25 GHz, which is lower than the analog bandwidth of 33 GHz. The signal, however, has significant energy beyond 25 GHz, so the recovered waveform appears aliased and the PAM4 pattern is not visible.

In high-speed signaling, there is a nominal UI, which is the inverse of the nominal bitrate or baud rate, for non-return to zero or PAM4, respectively. For example, 32 GBaud is the nominal baud rate for the serial computer expansion bus standard Peripheral Component Interconnect Express (PCIe) 6.0. The actual baud rate, however, is constantly changing during data transmission. Part of the UI/baud rate change is by design. For example, a SSC scheme purposely down spreads the system clock by 5000 parts per million (ppm) or 0.5% of the nominal baud rate. Another portion of the UI or baud rate change is from the intrinsic system clock jitter since the system clock is not a perfect clock. A clock data recovery unit, which may be part of the processor, in the test and measurement instrument is designed to track out or reduce the impact of low frequency jitter, including SSC, by making a recovered clock track the low frequency part of the system clock embedded in the data signal. There have been various software clock data recovery (SCDR) developed for real-time oscilloscopes when the raw sampled waveform data is not aliased. However, such SCDR do not work when the raw sampled waveform is aliased.

Examples of the disclosure are directed to clock data recovery for a real-equivalent-time test and measurement instrument or mode on a test and measurement instrument. The clock data recovery for the real-equivalent time mode or instrument can track the low frequency part of the UI changes.

Figure 12:
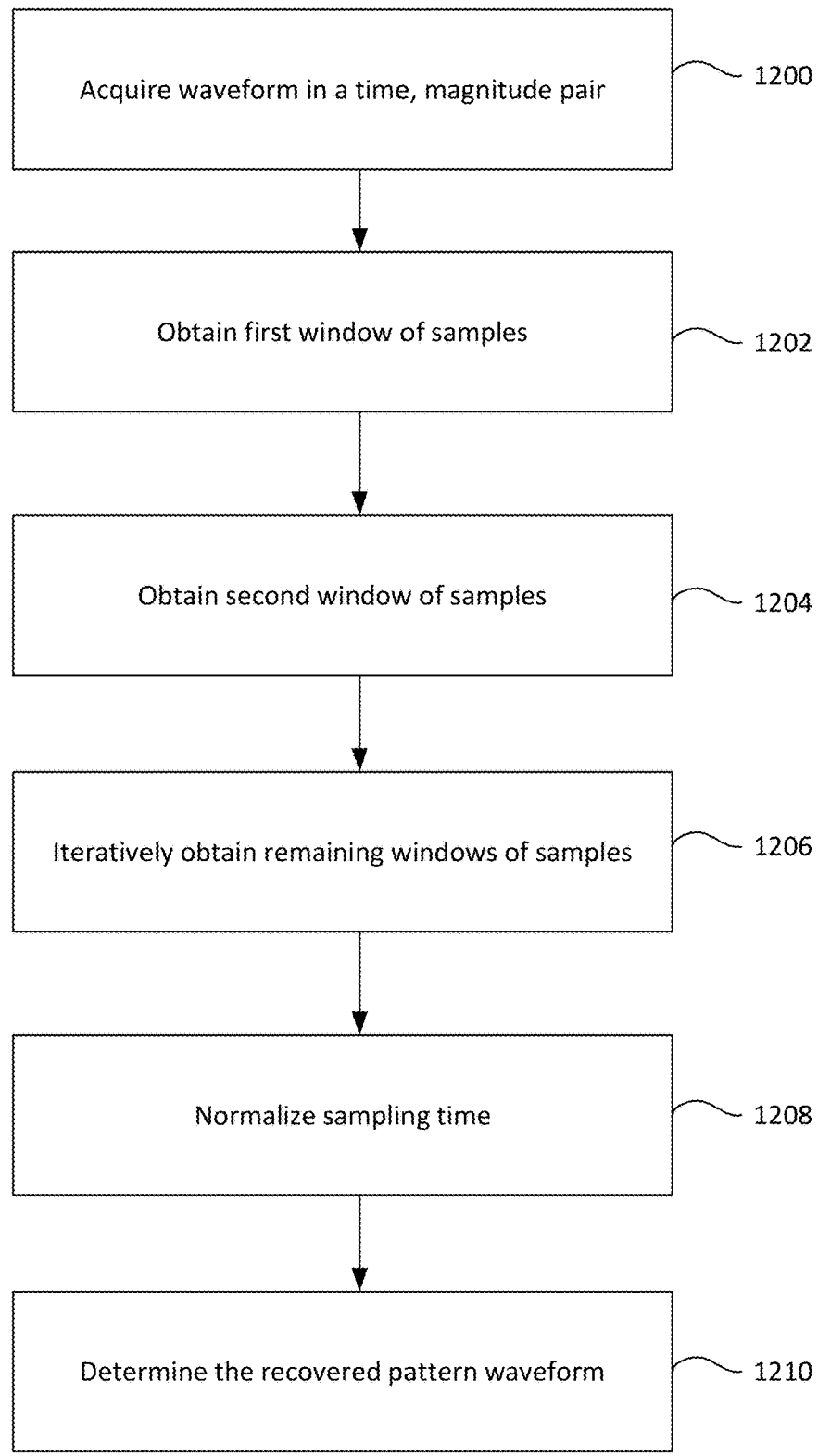
FIG. 12 is an example operation for recovering clock data and reconstructing a sampled waveform.

FIG. 12 is a flow chart illustrating the software clock recovery and reconstruction of a signal under test of a real-equivalent-time mode or instrument according to some examples of the disclosure. In operation 1200, the instrument samples or acquires a waveform in a time versus voltage (t, y) pair for an electrical signal or time versus power for an optical signal. For ease of discussion, electrical signals are discussed below, though as will be understood by one skilled in the art, the signals may be optical signals in some examples. The vector of the sampling time t is uniformly spaced. For example, when a sample rate is 3.125 GS/s, the spacing of vector t is the inverse of the constant sample rate.

In operation 1202, a first window of samples (t_i, y_i, i=1, 2, . . . , w) is obtained. The window size w is set to be large enough to have sufficient samples to calculate a local averaged UI value, but small enough to capture the slow change of the UI value.

To obtain the first window of samples, a set of estimated UI values {period_1_j, j=1, 2, . . . , p} around a nominal UI value is defined. For a first window of samples, the set has a large amount of estimated UI values. For example, when the test and measurement instrument has SSC on, the averaged UI value for the first window can be any value in the 5000 ppm range, plus the uncertainty of the system clock, so the period value p is set to be a very large value. The resolution of the estimated UI can be improved through iterative search.

For each estimated UI value period_1_j, a time vector as shown in equation (1) is defined as the normalized time offset for the eye diagram:

$$t\_eye\_ij = \mod(t\_i, period\_1\_j)/period\_1\_j \quad (1)$$

As t_eye_ij has one-to-one mapping with t_i, the pair (t_eye_ij, y_i, i=1, 2, . . . , w) can be determined and the eye diagram can be generated from this pair. For each of the estimated UI values of period_1_j, an eye diagram can be generated. Various operations may be used to choose the optimal j value which yields the best eye opening.

For example, one operation for choosing the optimal j value includes defining a vertical range {y_low, y_high} that covers part of the middle range of the obtained samples, such as, for example, around the mid-crossing level. The set of t_mid_crossing_j={t_eye_j} for each of j, y_j can be found that falls within the vertical range {y_low, y_high}.

Then, using equation (2), e_j_k can be determined:

$$e\_j\_k = std(\mod(t\_mid\_crossing\_j + t\_offset\_1\_k, 1)),$$
$$k = 1, 2, \ldots q \quad (2)$$

Where t_offset_1_k, k=1, 2, . . . , q is a set of offset values between [0, 1].

Then, for each j value, an optimal k value is found, which is denoted as jkOptimal:

$$e\_jk\text{Optimal} = \min(\{e\_j\_k\}), k = 1, 2, \ldots, q \quad (3)$$

An optimal j value, denoted as jOptimal, is found, such that:

$$e\_j\text{Optimal} = \min(\{e\_jk\text{Optimal}\}), j = 1, 2, \ldots, p \quad (4)$$

The pair of (jkOptimal, jOptimal) can be saved for later use. Here jkOptimal corresponds to jOptimal. At this point, the averaged UI value for the first window is period_1_jOptimal, and with a horizontal offset of t_offset_1_jkOptimal.

After obtaining the averaged UI for the first widow of samples in operation 1202, a second window of samples (t_i, y_i, i=w+1, w+2, . . . , 2w) is taken with the same window size w in operation 1204. The same process may be used to determine the averaged UI value period period_2_jOptimal for the samples in the second window and the horizontal offset of t_offset_2_jkOptimal. The search range for a unit interval for the second window of samples is narrower than the search range of the unit interval for the first window of samples.

The process of obtaining the second set of samples is slightly different in that the set of estimated UI values {period_2_j} is set to be around period_1_jOptimal instead of around the nominal UI value. Further, the period value p is set to a much smaller value to improve the clock data recovery speed because the low frequency change in UI value should not be too much or change too quickly.

In operation 1206, the remaining waveform samples are iterated through in the same manner as operation 1204 to determine the array of averaged UI values {period_n_jOptimal, n=1, 2, . . . , N} and the array of horizontal offset {t_offset_n_jkOptimal, n=1, 2, . . . , N}. The search range for UIs of each subsequent window of samples is narrower than the search range of the unit interval for the first window of samples.

In operation 1208, based on the array of averaged UI values {period_n_jOptimal, n=1, 2, . . . , N} and the array of horizontal offset {t_offset_n_jkOptimal, n=1, 2, . . . , N}, the absolute sampling time t is converted in the original waveform pair {t, y} to {t_normalized, y}. The normalized sampling time t_normalized represents the sampling time in the unit of UI instead of absolute time represented in sampling time t. Many different approaches that would be known to one skilled in the art can be used to calculate the normalized sampling time t_normalized, including filtering the averaged UI value {period_n_jOptimal, n=1, 2, . . . , N}.

In operation 1208, using a known pattern length of PatternLength, the pattern normalized sampling time can be derived as:

$$t\_pattern\_normalized = \mod(t\_normalized, \text{PatternLength}) \quad (5)$$

The pair of {t_pattern_normalized, y} can then be sorted in operation 1210 based on t_pattern_normalized to yield the pair of {t_pattern, y_pattern}. The pair of {t_pattern, y_pattern} represents the recovered or reconstructed pattern waveform from the real-equivalent-time acquisition. In some examples, the pattern waveform from the real-equivalent-time acquisition obtained using this process or operation may not be uniformly spaced in time. However, the pattern waveform can be re-sampled to be uniformly spaced in time in some examples.

In some examples, the operation of clock data recovery illustrated in FIG. 12 can be used on signal samples that are acquired on a real-time oscilloscope where the samples are not aliased.

As a numerical example, a signal from a source that generates 32 GBaud PAM4 PRBS13Q data pattern with and without SSC is obtained. The real-time-equivalent mode or instrument samples the signal at 3.125 GS/s. Since the sample rate in this example is far lower than the analog bandwidth to capture the 32 GBaud signal, the sampled waveform is aliased.

Figure 13:
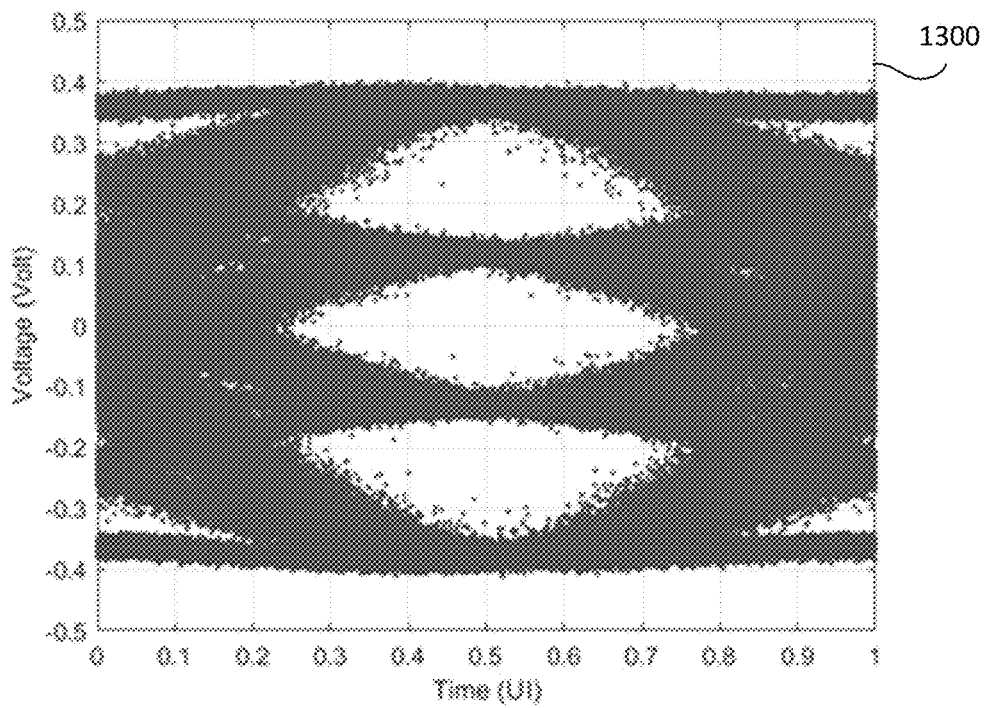
FIG. 13 is an eye diagram generated based on the operation of FIG. 12 with spread spectrum clocking turned off.
Figure 14:
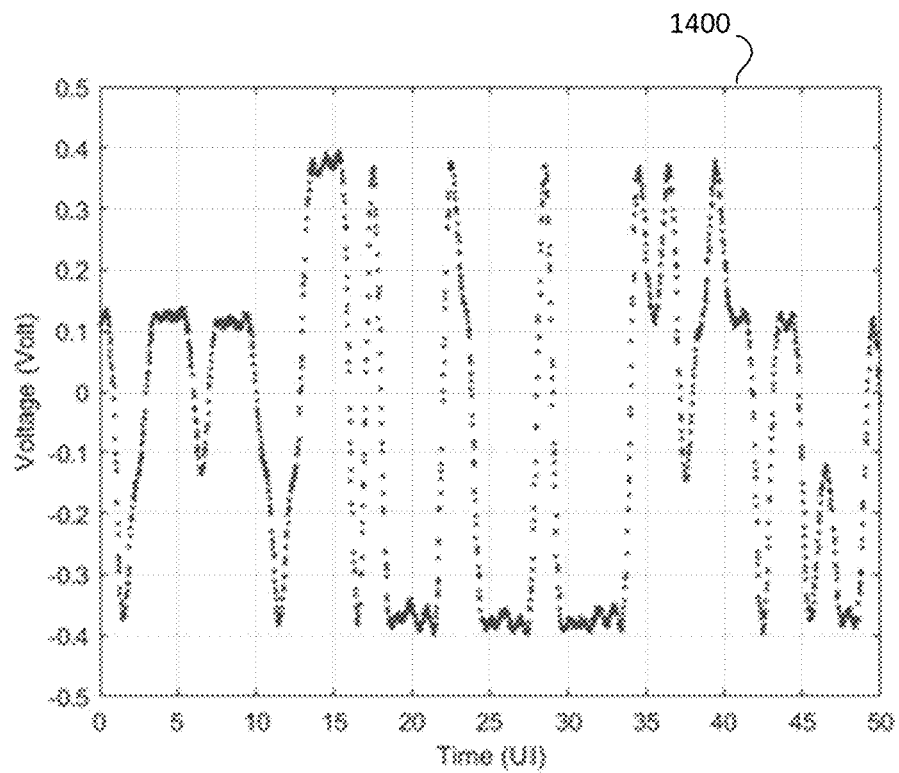
FIG. 14 is a plot of a unit interval as a function of time of FIG. 13 based on the operation of FIG. 12.
Figure 15:
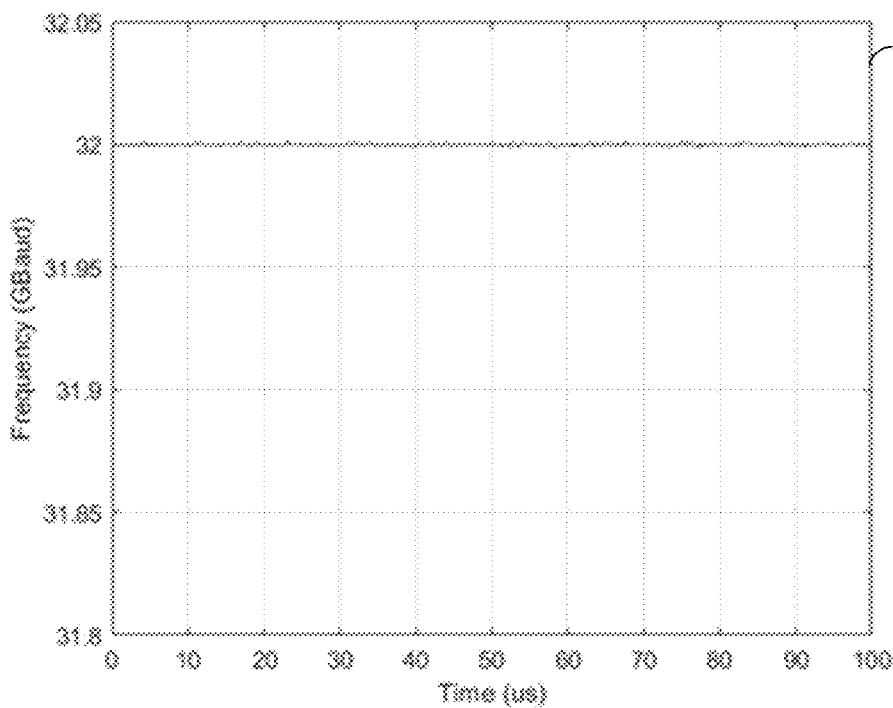
FIG. 15 is a reconstructed waveform based on the operation of FIG. 12 with spread spectrum clocking turned off.

FIGS. 13-15 illustrate an eye diagram 1300, a part of the reconstructed pattern waveform plotted 1400, and the UI as a function of time plotted 1500, respectively, of a signal obtained with SSC off. With SSC turned off, the system clock is relatively stable. The eye diagram 1300 plots each of the eye diagrams generated in operations 1202, 1204, and 1206. The plot 1400 illustrates the reconstructed waveform using the operation 1200. As can be seen, the pattern waveform illustrates a PRBS13Q signal. The plot 1500 in FIG. 15 illustrates that the system clock and baud rate are fairly stable with SSC turned off.

Figure 16:
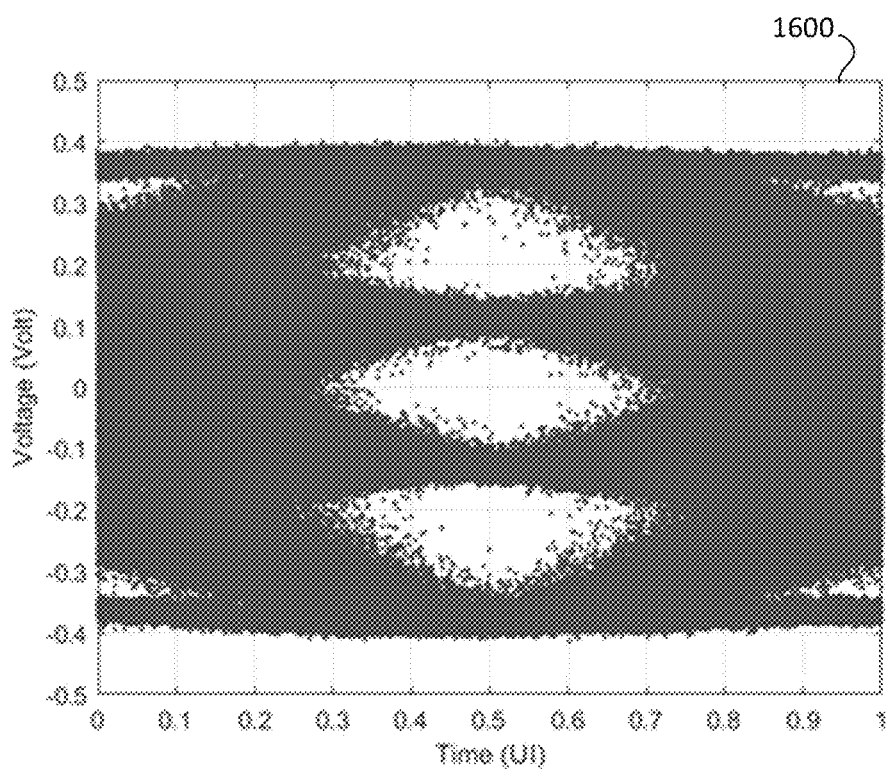
Figure 17:
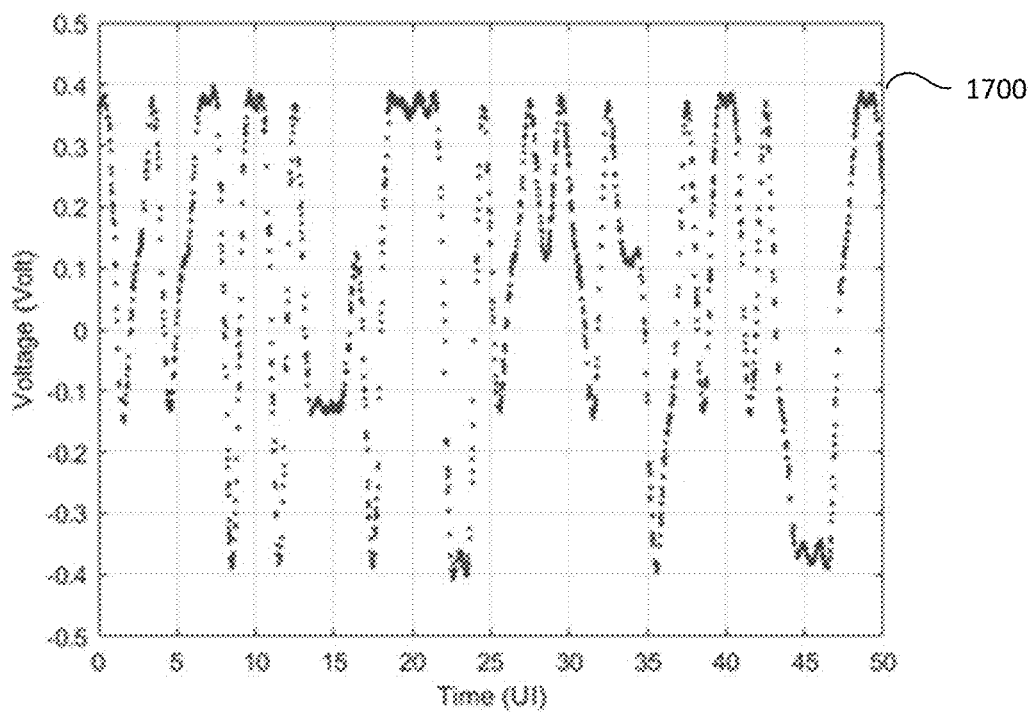
FIG. 17 is a plot of a unit interval as a function of time of FIG. 16 based on the operation of FIG. 12.
Figure 18:
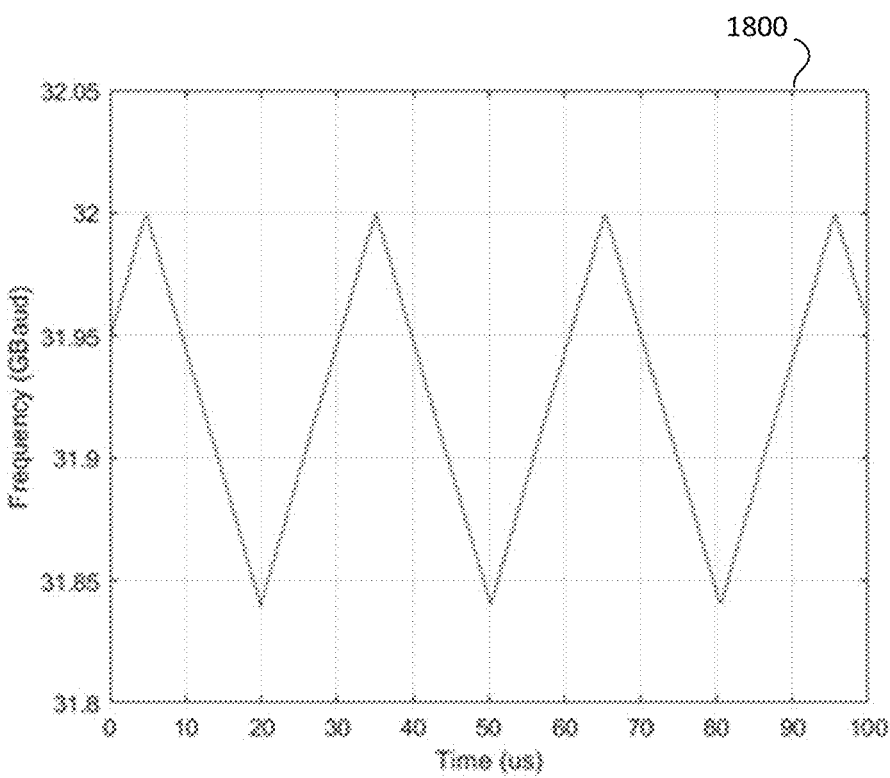

FIGS. 16-18 illustrate an eye diagram 1600, a part of the reconstructed pattern waveform plotted 1700, and the UI as a function of time plotted 1800, respectively, of a signal obtained with SSC turn on. With SSC turned on, FIG. 18 illustrates that the SSC provides a downward spreading to about 5000 ppm in the baud rate. FIGS. 16-18 illustrate that the operation illustrated in FIG. 12 and discussed above can track out most of the SSC as the eye diagram 1600 in FIG. 16 matches closely to the eye diagram 1300 of FIG. 13, indicating that the operation illustrated in FIG. 12 tracks out most of the SSC. Varying the window size in operation of FIG. 12 emulates the effects of different configurations of the phase-locked-loop (PLL) allowing for a more open eye diagram.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is an oscilloscope having a Nyquist frequency lower than an analog bandwidth, the oscilloscope comprising an input configured to receive a signal under test having a repeating pattern; a single analog-to-digital converter configured to receive the signal under test and sample the signal under test over a plurality of repeating patterns at a sample rate; and one or more processors configured to determine a frequency of the signal under test and reconstruct the signal under test based on the determined frequency of the signal under test and the sample rate without a trigger.

Example 2 is the oscilloscope of example 1, wherein the one or more processors are configured to determine the frequency of the signal under test by automatically generating an eye diagram and iteratively adjusting a selected frequency of the signal under test until a horizontal opening of the eye diagram is at its widest point.

Example 3 is the oscilloscope of either one of examples 1 or 2, further comprising a user input configured to receive a frequency of the signal under test from a user.

Example 4 is the oscilloscope of any one of examples 1-3, wherein the sample rate is between one giga-samples per second and one hundred giga-samples per second.

Example 5 is the oscilloscope of example 4, wherein the sample rate is between two giga-samples per second and twenty-five giga-samples per second.

Example 6 is the oscilloscope of any one of examples 1-5, wherein the single analog-to-digital converter is at least a 12-bit analog-to-digital converter.

Example 7 is the oscilloscope of any one of examples 1-6, wherein the one or more processors are configured to reconstruct the signal under test based on the determined frequency of the signal under test and the sample rate without a trigger by determining a corresponding position of each sampled component of the signal under test in the reconstructed signal under test based on the determined frequency and the sample rate.

Example 8 is the oscilloscope of any one of examples 1-7, wherein the one or more processors are further configured to adjust the sample rate of the analog-to-digital converter and to cause the analog-to-digital converter to sample the signal under test at different sample rates.

Example 9 is the oscilloscope of example 8, wherein the one or more processors are further configured to determine the frequency of the signal under test based on the sampled signal under test at different sample rates.

Example 10 is a method for reconstructing a signal under test in an oscilloscope having a Nyquist frequency lower than an analog bandwidth, comprising receiving the signal under test having a repeating pattern; sampling at a sample rate the signal under test over a plurality of repeating patterns to digitize the signal using a single analog-to-digital converter; determining a frequency of the sampled signal under test; and reconstructing the signal under test based on the determined frequency and the sampling rate without utilizing a trigger.

Example 11 is the method of example 10, wherein determining the frequency of the signal under test includes automatically generating an eye diagram and iteratively adjusting a selected frequency of the signal under test until a horizontal opening of the eye diagram is at its widest point.

Example 12 is the method of either one of examples 10 or 11, further comprising a receiving a frequency of the signal under test from a user input.

Example 13 is the method of any one of examples 10-12, wherein the sample rate is between one giga-samples per second and one hundred giga-samples per second.

Example 14 is the method of example 13, wherein the sample rate is between two giga-samples per second and twenty-five giga-samples per second.

Example 15 is the method of any one of examples 10-14, wherein the single analog-to-digital converter is at least a 12-bit analog-to-digital converter.

Example 16 is the method of any one of examples 10-15, further comprising adjusting the sample rate of the analog-to-digital converter and causing the analog-to-digital converter to sample the signal under test at different sample rates.

Example 17 is the method of example 16, wherein determining the frequency of the signal under test includes determining the frequency of the signal under test based on the sampled signal under test at different sample rates.

Example 18 is one or more computer-readable storage media comprising instructions, which, when executed by one or more processors of a test and measurement instrument, cause the test and measurement instrument to receive the signal under test having a repeating pattern; sample at a sample rate the signal under test over a plurality of repeating patterns to digitize the signal using a single analog-to-digital converter; determine a frequency of the sampled signal under test; and reconstruct the signal under test based on the determined frequency and the sampling rate without utilizing a trigger.

Example 19 is the one or more computer-readable storage media of example 18, further comprising instructions that cause the test and measurement instrument to determine the frequency of the signal under test by automatically generating an eye diagram and iteratively adjusting a selected frequency of the signal under test until a horizontal opening of the eye diagram is at its widest point.

Example 20 is the one or more computer-readable storage media of either one of examples 18 or 19, wherein the sample rate is between one giga-samples per second and one hundred giga-samples per second.

Example 21 is an oscilloscope having a real-time mode and a real-equivalent-time mode, comprising first and second channels; first and second analog-to-digital converters; and one or more processors configured to during the real-time mode, electrically couple the first channel to both the first and second analog-to-digital converters and uncouple the second channel from the first and the second analog-to-digital converters, and during the real-equivalent-time mode, electrically couple the first channel to the first analog-to-digital converter and couple the second channel to the second analog-to-digital converter.

Example 22 is the oscilloscope of example 21, wherein during the real-equivalent-time-mode, the one or more processors are further configured to determine a frequency of a signal under test received at the first channel and reconstruct the signal under test based on the determined frequency of the signal under test and a sample rate of the first analog-to-digital converter without a trigger.

Example 23 is the oscilloscope of example 22, wherein the signal under test includes a repeating pattern.

Example 24 is the oscilloscope of example 23, wherein the one or more processors are configured to determine the frequency of the signal under test by automatically generating an eye diagram and iteratively adjusting a selected frequency of the signal under test until a horizontal opening of the eye diagram is at its widest point.

Example 25 is the oscilloscope of either one of examples 23 or 24, wherein the one or more processors are further configured to reconstruct the signal under test based on the determined frequency of the signal under test and the sample rate without a trigger by determining a corresponding position of each sampled component of the signal under test in the reconstructed signal under test based on determined frequency and the sample rate Example 26 is the oscilloscope of any one of examples 23-25, wherein the one or more processors are further configured to adjust the sample rate of the analog-to-digital converter and to cause the analog-to-digital converter to sample the signal under test at different sample rates.

Examples 27 is the oscilloscope of example 26, wherein the one or more processors are further configured to determine the frequency of the signal under test based on the sampled signal under test at different sample rates.

Example 28 is the oscilloscope of any one of examples 22-26, further comprising a user input configured to receive a frequency of the signal under test from a user.

Example 29 is the oscilloscope of any one of examples 21-28, further comprising a plurality of switches, wherein the one or more processors are further configured to control each of the plurality of switches to electrically couple the first and the second channel to the first and the second analog-to-digital converters based on a mode of the test and measurement instrument.

Example 30 is the oscilloscope of any one of examples 21-29, wherein the one or more processors are further configured to sample a signal under test in either real-time mode or the real-equivalent-time mode and reconstruct the signal under test by obtaining a first window of samples, including estimating unit interval values around a nominal unit interval value to determine an averaged first unit interval value having a first period value; obtaining a second window of samples, including estimating unit interval values around the averaged first unit interval value to determine an averaged second unit interval value with a search range of unit intervals for the second window of samples narrower than a search range of the unit interval for the first window of samples; normalizing a sampling time based on the first window of samples and the second window of samples; and reconstructing the signal under test based on normalized sampling time.

Example 31 is a method for reconstructing a signal under test in an oscilloscope, comprising sampling a signal under test; determining a nominal unit interval value based on the signal under test; obtaining a first window of samples, including estimating unit interval values around the nominal unit interval value to determine an averaged first unit interval value having a first period value; obtaining a second window of samples, including estimating unit interval values around the averaged first unit interval value to determine an averaged second unit interval value with a search range of unit intervals for the second window of samples narrower than a search range of the unit interval for the first window of samples; normalizing a sampling time based on the first window of samples and the second window of samples; and reconstructing the signal under test based on the normalized sampling time.

Example 32 is the method of example 31, wherein the signal under test includes a repeating pattern.

Example 33 is the method of either one of examples 31 or 32, wherein sampling the signal under test includes acquiring a signal under test with an analog bandwidth greater than a Nyquist frequency of an analog-to-digital converter that samples the signal under test.

Example 34 is the method of any one of examples 31-33, further comprising obtaining a third window of samples, including estimating unit interval values around the averaged second unit interval value to determine an averaged third unit interval value with a search range of unit intervals for the third window of samples narrower than a search range of the unit interval for the first window of samples; and normalizing a sampling time based on the first window of samples, the second window of samples, and the third window of sample.

Example 35 is one or more computer-readable storage media comprising instructions, which, when executed by one or more processors of a test and measurement instrument, cause the test and measurement instrument to during a real-time mode, electrically couple a first channel to both a first analog-to-digital converter and a second analog-to-digital converter and uncouple a second channel from the first analog-to-digital converter and the second analog-to-digital converter and acquire a signal under test; during a real-equivalent-time mode, electrically couple the first channel to the first analog-to-digital converter only and electrically couple the second channel to the second analog-to-digital converter only and acquire a signal under test at one of the first channel or the second channel.

Example 36 is one or more computer-readably storage media of example 35, further comprising instructions that cause the test and measurement instrument, during the real-equivalent-time-mode, to determine a frequency of a signal under test received at the first channel and reconstruct the signal under test based on the determined frequency of the signal under test and a sample rate of the first analog-to-digital converter without a trigger.

Example 37 is one or more computer-readable storage media of example 36, wherein the signal under test includes a repeating pattern Example 38 is the one or more computer-readable storage media of example 37, further comprising instructions that cause the test and measurement instrument to determine the frequency of the signal under test by automatically generating an eye diagram and iteratively adjusting a selected frequency of the signal under test until a horizontal opening of the eye diagram is at its widest point.

Example 39 is the one or more computer-readable storage media of any one of examples 35-38 further comprising instructions that cause the test and measurement instrument in either the real-time mode or the real-equivalent-time mode, to sample a signal under test at either the first channel or the second channel; determine a nominal unit interval value based on the signal under test; obtain a first window of samples, including estimating unit interval values around the nominal unit interval value to determine an averaged first unit interval value having a first period value; obtain a second window of samples, including estimating unit interval values around the averaged first unit interval value to determine an averaged second unit interval value with a search range of unit intervals for the second window of samples narrower than a search range of the unit interval for the first window of samples; normalize a sampling time based on a the first window of samples and the second window of samples; and reconstruct the signal under test based on the normalized sampling time.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. An oscilloscope having a Nyquist frequency lower than an analog bandwidth, the oscilloscope comprising:
  an input configured to receive a signal under test;
  a single analog-to-digital converter configured to receive the signal under test, sample the signal under test at a sample rate, and produce digital samples of the signal under test at a single output; and one or more processors configured to determine, without a trigger and without hardware clock recovery, a frequency of the signal under test, and to reconstruct, using the digital samples from only the single analog-to-digital converter, a representation of the signal under test based on the determined frequency of the signal under test and the sample rate.

2. The oscilloscope of claim 1, wherein the one or more processors are configured to determine the frequency of the signal under test by automatically generating an eye diagram and iteratively adjusting a selected frequency of the signal under test until a horizontal opening of the eye diagram is at its widest point.

3. The oscilloscope of claim 1, further comprising a user input configured to receive a frequency of the signal under test from a user.

4. The oscilloscope of claim 1, wherein the sample rate is between one giga-samples per second and one hundred giga-samples per second.

5. The oscilloscope of claim 4, wherein the sample rate is between two giga-samples per second and twenty-five giga-samples per second.

6. The oscilloscope of claim 1, wherein a resolution of the single analog-to-digital converter is at least 12-bits.

7. The oscilloscope of claim 1, wherein the one or more processors are configured to reconstruct the signal under test based on the determined frequency of the signal under test and the sample rate without a trigger by determining a corresponding position of each sampled component of the signal under test in the reconstructed signal under test based on determined frequency and the sample rate.

8. The oscilloscope of claim 1, wherein the one or more processors are further configured to adjust the sample rate of the analog-to-digital converter and to cause the analog-to-digital converter to sample the signal under test at different sample rates.

9. A method for reconstructing a signal under test in an oscilloscope having a Nyquist frequency lower than an analog bandwidth, comprising:

receiving the signal under test;

sampling at a sample rate the signal under test to digitize the signal using a single analog-to-digital converter having a single output for digital samples of the signal under test;

determining, without using a trigger and without using hardware clock recovery, a frequency of the sampled signal under test; and reconstructing, using the digital samples from only the single analog-to-digital converter, a representation of the signal under test based on the determined frequency and the sampling rate.

10. The method of claim 9, wherein determining the frequency of the signal under test includes automatically generating an eye diagram and iteratively adjusting a selected frequency of the signal under test until a horizontal opening of the eye diagram is at its widest point.

11. The method of claim 9, further comprising receiving a frequency of the signal under test from a user input.

12. The method of claim 9, wherein the sample rate is between one giga-samples per second and one hundred giga-samples per second.

13. The method of claim 12, wherein the sample rate is between two giga-samples per second and twenty-five giga-samples per second.

14. The method of claim 9, wherein a resolution of the single analog-to-digital converter is at least 12-bits.

15. The method of claim 9, further comprising adjusting the sample rate of the analog-to-digital converter and causing the analog-to-digital converter to sample the signal under test at different sample rates.

16. The method of claim 9, wherein determining the frequency of the signal under test includes determining the frequency of the signal under test based on the sampled signal under test at different sample rates.

* * * * *